US005789922A

United States Patent [19]

Ochi et al.

[11] Patent Number: 5,789,922
[45] Date of Patent: Aug. 4, 1998

[54] INSPECTING METHOD AND APPARATUS BASED ON NUCLEAR MAGNETIC RESONANCE USING BURST WAVE AS EXCITING HIGH FREQUENCY PULSE

[75] Inventors: Hisaaki Ochi, Kodaira; Etsuji Yamamoto, Akishima; Yo Taniguchi, Hachioji, all of Japan

[73] Assignees: Hitachi, Ltd.; Hitachi Medical Corporation, both of Tokyo, Japan

[21] Appl. No.: 645,478

[22] Filed: May 13, 1996

[30] Foreign Application Priority Data

May 16, 1995 [JP] Japan ................. 7-117015

[51] Int. Cl.$^6$ ................................................. A61B 5/55
[52] U.S. Cl. ........................................ 324/314; 324/309
[58] Field of Search ........................ 324/300, 307, 324/309, 318; 128/653.2; 600/410

[56] References Cited

U.S. PATENT DOCUMENTS 5,126,673  6/1992  Hennig ...................... 324/309
5,212,448  5/1993  Le Roux et al. ............ 324/309
5,544,652  8/1996  Duyn ...................... 128/653.2

OTHER PUBLICATIONS

J. Duyn, P. van Gelderen, G. Liu, C.T.W. Moonen, Fast Volume Scanning with Frequency-Shifted BURST MRI. Magn. Reson. Med. 32, 429–432, 1994.
L. Zha, R.E. Wysong, and I.J. Lowe, Optimized Ultra-Fast Imaging Sequence (OUFIS), in "Proc., SMRM, 10th Annual Meeting, 1993," p. 471.

*Primary Examiner*—Sandra L. O'Shea
*Assistant Examiner*—Michael Elsenberg
*Attorney, Agent, or Firm*—Antonelli, Terry, Stout & Kraus, LLP

[57] ABSTRACT

In an inspecting method based on nuclear magnetic resonance, a burst wave having a plurality of sub-pulses frequency-modulated with a high frequency is generated, the burst wave is amplitude-modulated with at least a function which repeats polarity inversion, the amplitude-modulated burst wave is irradiated, as an exciting high frequency pulse, to an object to be inspected, and gradient magnetic fields are generated in predetermined pulse sequence to measure a nuclear magnetic resonance signal.

46 Claims, 14 Drawing Sheets

FIG. 7A    FIG. 7B
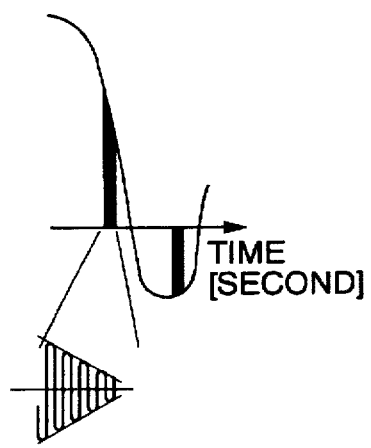    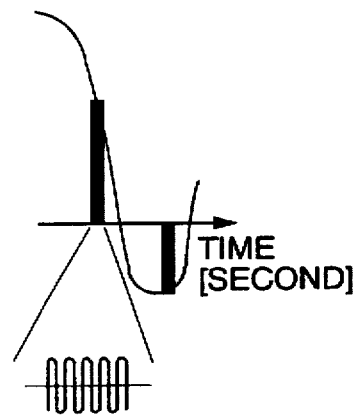
FIG. 8
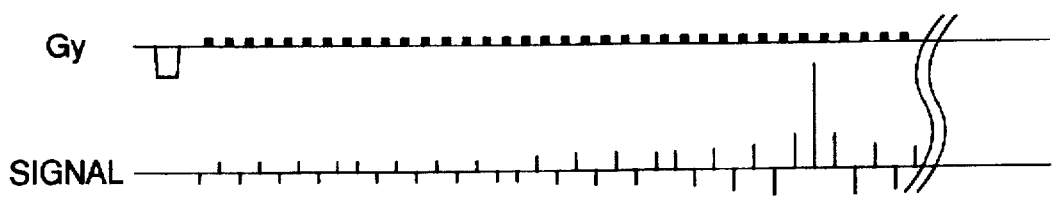

$\tau$ = 200 MICRO SECONDS
T = 267 MICRO SECONDS

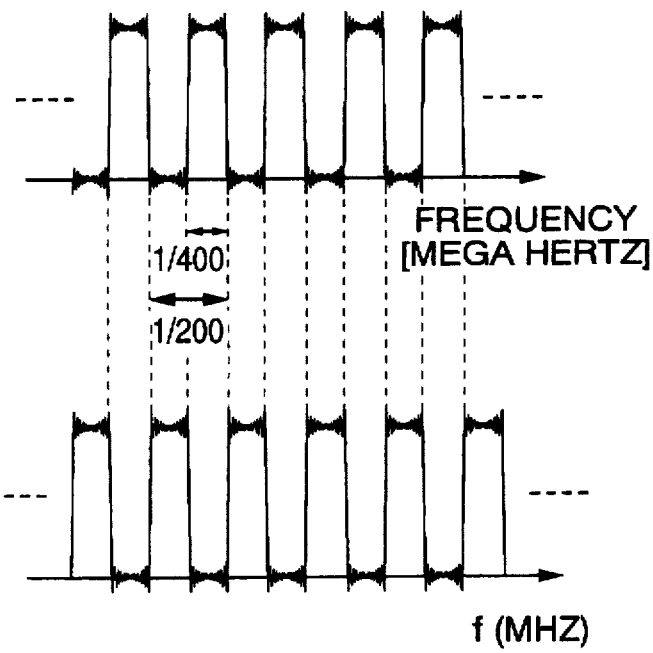

INSPECTING METHOD AND APPARATUS BASED ON NUCLEAR MAGNETIC RESONANCE USING BURST WAVE AS EXCITING HIGH FREQUENCY PULSE

BACKGROUND OF THE INVENTION

The present invention relates to a measuring method using nuclear magnetic resonance and more particularly to inspecting method and apparatus based on nuclear magnetic resonance using a burst wave as an exciting high frequency pulse.

A magnetic resonance imaging apparatus to which the measuring method based on nuclear magnetic resonance is applied is used to measure a tomographic image of an object to be inspected by utilizing nuclear magnetic resonance.

In this type of apparatus, for excitation of atomic nuclei in the object to be inspected, a high frequency pulse of a frequency proportional to the intensity of a static magnetic field is applied. A method is known in which a burst wave is applied as an exciting high frequency pulse ("DANTE Ultrafast Imaging Sequence (DUFIS)" by I. J. Lowe and R. E. Wysong, Journal of Magnetic Resonance, Series B 101, pp 106–109 (1993)). The term "burst wave" means a series of high frequency pulses in the form of a pulse train. A burst wave is constituted of a plurality of sub-pulses.

As shown in FIG. 1A, when a burst wave on time axis undergoes Fourier transform, it is transformed into a burst on frequency axis resembling the burst wave on time axis. Given that the interval of the burst wave on time axis, that is the interval of the sub-pulses is $\tau$ (seconds), the interval of the burst on frequency axis is $1/\tau$ (hertz).

FIG. 1B shows an example of imaging sequence for applying the aforementioned burst wave as an exciting high frequency pulse. In the figure, abscissa represents the time and ordinate represents the intensity of the high frequency pulse or gradient magnetic fields. Actually, individual pulses (sub-pulses) constituting a burst wave 21 are pulses which are modulated in frequency (frequency-modulated) with a magnetic resonance frequency as shown in FIG. 2A. For simplification of description, in the present specification, one sub-pulse is expressed as a line having specified time width and amplitude above time axis as shown in FIG. 2B. FIG. 2C shows a pulse having its phase inverted to that of the pulse shown in FIG. 2A. The pulse shown in FIG. 2C is expressed as a line having specified time width and amplitude below time axis as shown in FIG. 2D so as to be distinguished from the pulse shown in FIG. 2A.

When a gradient magnetic field Gx having an intensity gradient and the burst wave 21 are applied simultaneously to an object in x direction, only atomic nuclei existing in thin strips as shown in FIG. 1C are excited. The position of the strips in FIG. 1C is determined in real space by an interval $\tau$ (seconds) of the burst wave on time axis and an intensity gradient (tesla/meter) of the gradient magnetic field Gx. For example, given that $\tau$ is 200 microseconds and the intensity gradient of the gradient magnetic field Gx is 46.5 millitesla/meter, a hydrogen atomic nucleus has a magnetic resonance frequency of about 43 MHz at one tesla under the application of this gradient magnetic field and therefore, hydrogen atomic nuclei which are apart from each other by one millimeter have magnetic resonance frequencies which differ by about 2 kilohertz. Since the interval of the burst on frequency axis as a result of Fourier transform of the burst wave on time axis is $1/\tau = 1/(200 \times 10^{-6}) = 5$ kilohertz, thin strips in which atomic nuclei are excited exist in real space at intervals of 5 kHz/(2 kHz/1 mm)=2.5 millimeter in x direction. For example, when the burst wave has 64 sub-pulses, the strip has a width of about 0.039 mm (=2.5 mm/64).

Next, when a slice gradient magnetic field Gz having an intensity gradient and a $\pi$ pulse are applied simultaneously to the object in z direction, magnetic moment of atomic nuclei existing in strips in a portion on z axis corresponding to a frequency of the $\pi$ pulse, that is, a slice having a specified width vertical to the z axis is inverted, so that the phases of magnetic moment of atomic nuclei existing in strips which are present outside the slice are dispersed.

When the gradient magnetic field Gx serving as a read-out gradient magnetic field is again applied, the phases of magnetic moment of atomic nuclei existing in the strips within the slice are again aligned and the same number of echo signals 22 as that of sub-pulses of the burst wave can be observed.

At that time, by applying a phase encode gradient magnetic field Gy simultaneously with the read-out gradient magnetic field, position information in y direction can be added to the echo signals 22. Thereafter, by conducting an image reconstruction processing based on the echo signals 22, a tomographic image can be obtained.

In FIG. 1B, a gradient magnetic field keeping its magnitude constant for a constant time is applied as the phase encode gradient magnetic field but a gradient magnetic field of blip form may sometimes be used. Also, in FIG. 1B, the read-out gradient magnetic field is applied in the x direction, the phase encode gradient magnetic field is applied in the y direction and slicing is in the z direction but they may be effected in desirably selected directions.

In the imaging sequence shown in FIG. 1B, imaging can be carried out at a high speed, but on the other hand, the S/N ratio of images is disadvantageously poor because only atomic nuclei existing in the strip within the slice can be excited.

Known as a method for exciting atomic nuclei existing in an imaging slice as many as possible, that is, a method for exciting also atomic nuclei existing between strips in order to improve the S/N ratio of images is a method of changing the phase of a burst wave ("Optimized Ultra-Fast Imaging Sequence (OUFIS)" by L. Zha, R. E. Wysong and L. J. Lowe, Proc., SMRM, 10th Annual Meeting, 1993, page 471) or a method of changing the frequency of a burst wave ("Fast Volume Scanning with Frequency-shifted Burst MRI" by J. H. Duyn, P. V. Gelderen, G. Liu and C. T. W. Moonen, Magn. Reson. Med., Vol. 32, pp. 429–432 (1994)).

By changing the phases of individual sub-pulses of a burst wave on time axis in suitable order, a pulse on frequency axis as a result of Fourier transform of the burst wave can be moved to left or right. In the former method utilizing this phenomenon, atomic nuclei existing between strips can also be excited by changing the phases of individual sub-pulses of a burst wave in suitable order.

A pulse can also be moved to left or right on a frequency axis by changing the frequency with which a burst wave is modulated. The latter method utilizes this phenomenon to obtain a three-dimensional image. More particularly, while atomic nuclei between strips are also excited in such order that after an echo signal is obtained by applying a first burst wave modulated with a modulation frequency to an object, another echo signal is obtained by applying a second burst wave modulated with another modulation frequency which is slightly shifted from the modulation frequency for the first burst wave and still another echo signal is obtained by applying still another burst wave subject to slight shifting of modulation frequency in a similar way, a phase encode gradient magnetic field is applied in y and z directions to obtain three-dimensional information of the object.

Of the above inspecting methods based on nuclear magnetic resonance, the former method for changing the phases of individual sub-pulses of a burst wave, however, still faces a problem that when the spatial intensity distribution of the high frequency pulse is non-uniform within an imaging slice, ideal operation cannot be ensured partly because of a limit to sensitivity of the receiver.

The latter method for sequentially applying burst waves subject to slightly different modulation frequencies to obtain three-dimensional information still faces a problem that the measurement time increases.

SUMMARY OF THE INVENTION

The present invention contemplates elimination of the above problems and it is an object of the present invention to provide an inspecting method and apparatus based on nuclear magnetic resonance which can reduce the measurement time and which can produce an image of improved S/N ratio in a simple manner.

Of inventions disclosed in the present application, typical ones will be summed up briefly as below.

Method 1

In an inspecting method based on nuclear magnetic resonance in which an exciting high frequency pulse in the form of a burst wave is applied to an object placed in a predetermined magnetic field space and a signal attributable to nuclear magnetic resonance generated in the object is taken out to prepare a tomographic image of the object, the amplitude of the burst wave used as the exciting high frequency pulse is modulated with a specified function which repeats polarity inversion. The specified function may otherwise be a function which repeats polarity inversion and which changes its amplitude during at least a part of duration each time that the polarity inversion occurs.

According to method 1, as will be clear from the result of Fourier transform of the exciting high frequency pulse, the band the atomic nuclei are excited can be increased, so that the S/N ratio can be improved.

Thanks to the use of the burst wave modulated with the specified function as the exciting high frequency pulse, the above advantage can be obtained in a simple manner.

Method 2

In method 1, a sinc function is used as the specified function.

Since the sinc function has hitherto been used frequently, an existent modulation unit can be used without alternation or modification.

Method 3

In method 1 or 2, the exciting high frequency pulse in the form of the burst wave whose amplitude is modulated with the specified function is such that the ratio between the period (T) of the function used for amplitude modulation and the interval ($\tau$) of the sub-pulses is set to a specified value.

According to method 3, the S/N ratio is determined by the ratio between the period (T) of the function used for amplitude modulation and the interval ($\tau$) of the sub-pulses and a desired S/N ratio can therefore be obtained.

Method 4

In method 3, the interval ($\tau$) of the sub-pulses is set to $T/2 \leq \tau < T$ in relation to the period (T) of the function used for amplitude modulation. By performing setting in this manner, the S/N ratio can be improved sufficiently.

Method 5

In method 1, the exciting high frequency pulse consists of burst waves which are modulated in amplitude with the same function or a plurality of functions, and modulation frequencies for sub-pulses of each of the burst waves are so set as to be shifted from each other by a value obtained by dividing reciprocal of the interval ($\tau$) of the sub-pulses by the specified value described in method 3.

Through this, all atomic nuclei can be excited without exception to drastically improve the S/N ratio.

Method 6

In an inspecting method based on nuclear magnetic resonance in which an exciting high frequency pulse in the form of a burst wave is applied to an object placed in a predetermined magnetic field space and a signal attributable to nuclear magnetic resonance generated in the object is taken out to prepare a tomographic image of the object, a first burst wave and a second burst wave are generated as the exciting high frequency pulse, the second burst wave being of the same waveform as that of the first burst wave and having a modulation frequency for sub-pulses shifted from that for sub-pulses of the first burst wave by a value obtained by dividing reciprocal of the interval ($\tau$) of the sub-pulses by 2 and a phase "$\alpha$" which satisfies $-90° \leq \alpha \leq 90°$ shifted from that of the first burst wave, and these burst waves are applied to two feeding points for QD irradiation to produce an NMR signal.

According to method 6, all atomic nuclei can be excited without exception as in the case of method 5 to drastically improve the S/N ratio.

Method 7

In an inspecting method based on nuclear magnetic resonance in which an exciting high frequency pulse in the form of a burst wave form is applied to an object placed in a predetermined magnetic field space and a signal attributable to nuclear magnetic resonance generated in the object is taken out to prepare a tomographic image of the object, a read-out gradient magnetic field and a phase encode gradient magnetic field are applied to the object while the polarities of these magnetic fields are inverted sequentially and the intensity of the phase encode gradient magnetic field is sequentially changed every inversion.

According to method 7, a high-speed or fast processing can be ensured.

Method 8

In method 7, the total of flip angle values of sub-pulses of the burst wave is set to larger than 90° and smaller than 180°.

According to method 8, the high-speed processing can be ensured and in addition artifacts can be reduced.

As is clear from the foregoing, according to the inspecting method based on nuclear magnetic resonance of the present invention, the measurement time can be shortened and an image of improved S/N ratio can be obtained in a simple manner.

BRIEF DESCRIPTION OF THE DRAWINGS

FIGS. 7A and 7B are diagrams for explaining waveforms of sub-pulses constituting the burst wave.

FIG. 8 is a diagram showing an embodiment of a phase encode gradient magnetic field according to the present invention.

FIGS. 11C and 11D are diagrams for explaining advantages of the embodiment shown in FIG. 11A.

DESCRIPTION OF THE PREFERRED EMBODIMENTS

Figure 3A:
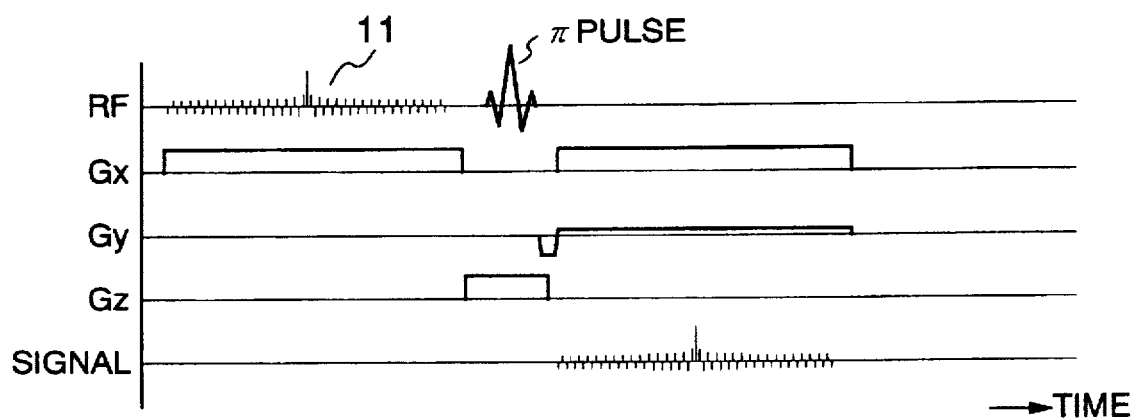
FIG. 3A is a time chart showing an embodiment of imaging pulse sequence according to the present invention.

FIG. 3A is a time chart useful to explain an embodiment of an inspecting method using nuclear magnetic resonance according to the present invention, depicting an imaging pulse sequence to be incorporated in a nuclear magnetic resonance apparatus.

Figure 1A:
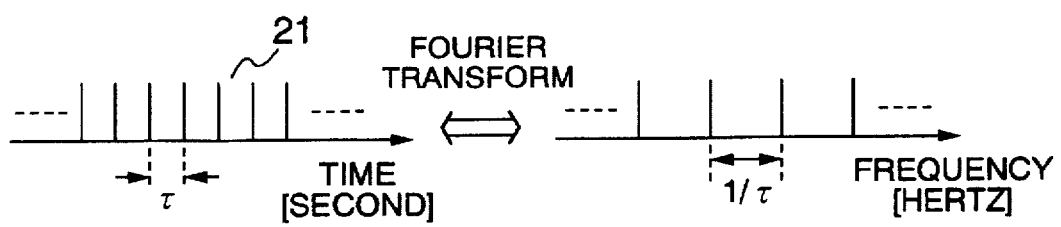
FIGS. 1A to 1C are diagrams for explaining a conventional inspecting method based on nuclear magnetic resonance.
Figure 1B:
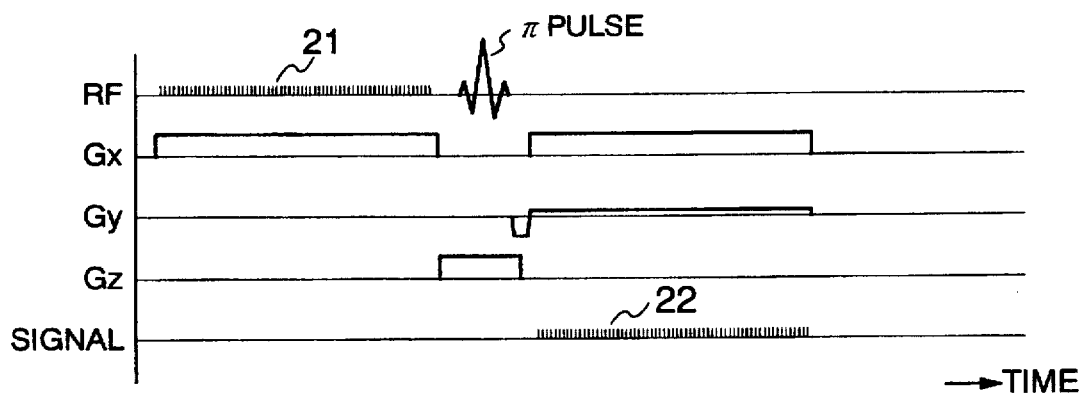
Figure 3B:
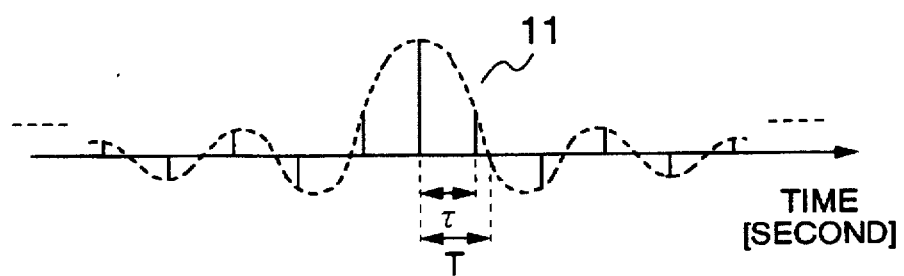
FIG. 3B is a waveform diagram showing an embodiment of a burst wave serving as an exciting high frequency pulse according to the present invention.

The imaging pulse sequence shown in FIG. 3A is the same as that shown in FIG. 1B with the only exception that a pulse shown in FIG. 3B is used as an exciting high frequency pulse 11.

The exciting high frequency pulse 11 shown in FIG. 3B is obtained by amplitude-modulating a burst wave consisting of, for example, 64 sub-pulses with a sinc function.

Figure 4A:
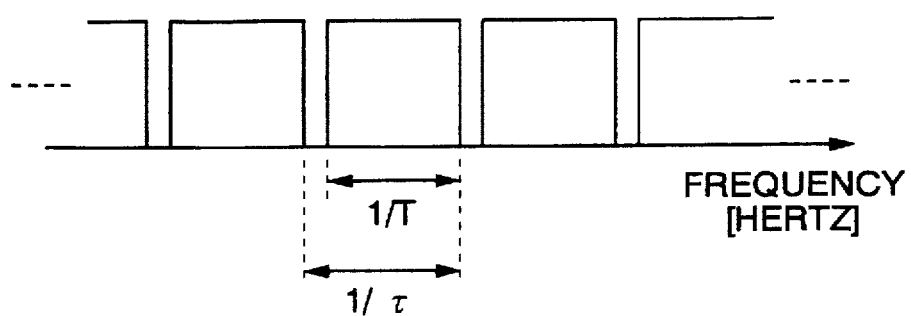
FIGS. 4A and 4B are diagrams showing waveforms of the burst wave of FIG. 3B subject to Fourier transform.

When the burst wave on time axis which is amplitude-modulated with the sinc function in this manner undergoes Fourier transform, it is transformed into a square periodic wave having a specified width on frequency axis as shown in FIG. 4A. Given that the interval of the sub-pulses on time axis is τ (seconds), the period of the square periodic wave on frequency axis is 1/τ (hertz) and given that the period of the sinc function with which the burst wave on time axis is amplitude-modulated is T (seconds), the width of the square periodic wave on frequency axis is 1/T (hertz).

Figure 4B:
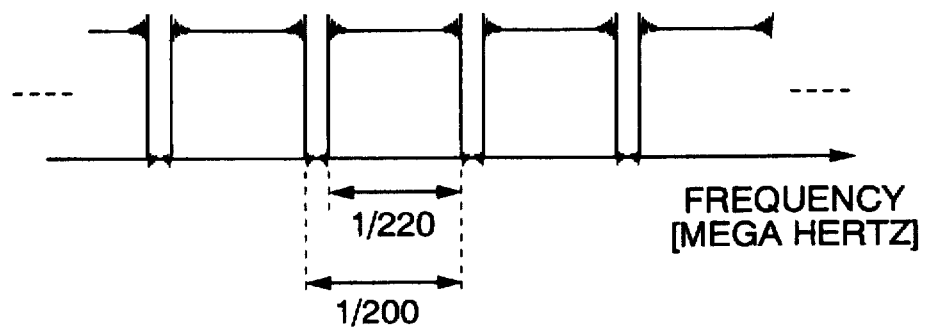

It is now assumed that the interval τ of the sub-pulses on time axis is, for example, 200 microseconds and the period T of the sinc function with which the burst wave is amplitude-modulated is 220 microseconds. In this embodiment, the number of sub-pulses of the burst wave on time axis is finite, amounting to 64 and therefore, when the burst wave on time axis is Fourier transformed, a resulting wave is not a perfect square periodic wave on frequency axis but suffers a Gibbs' phenomenon as shown in FIG. 4B. The Gibbs' phenomenon gives rise to so-called artifacts but will not do particular harm in attaining advantages of the present embodiment and can be eliminated sufficiently by, for example, modifying the video signal as known in the art.

Since, in the exciting frequency pulse 11, the sub-pulses on time axis has an interval τ of 200 microseconds and the sinc function with which the burst wave on time axis is amplitude-modulated has a period of 220 microseconds, a band having a value of zero on frequency axis is about 10% or less of the entire region as shown in FIG. 4B and hence about 90% or more of atomic nuclei within an imaging slice can be excited.

In the present invention, τ and T are set so as to satisfy $T/2 \leq \tau < T$.

Figure 1C:
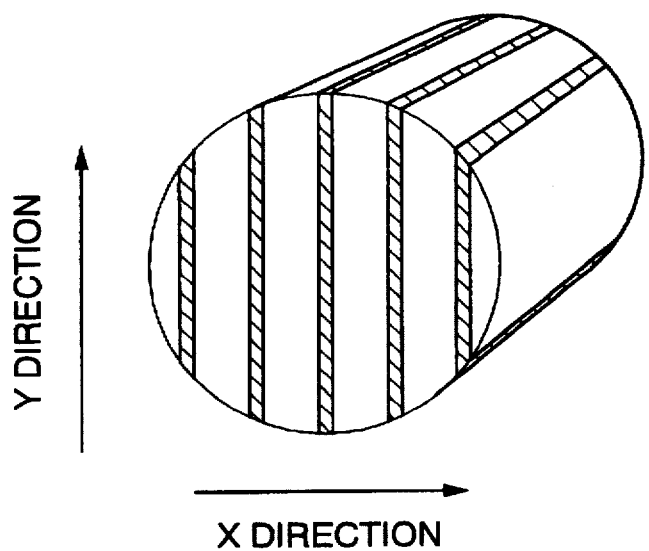
Figure 5:
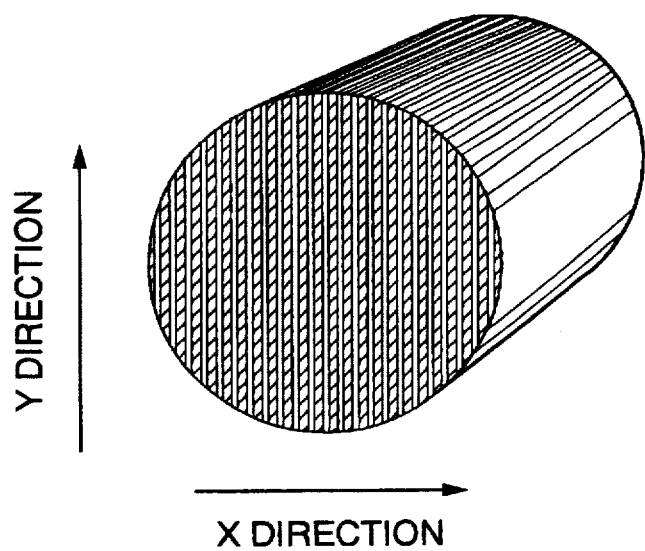
FIG. 5 is a diagram for explaining advantages of the present invention.

FIG. 5 is a diagram corresponding to that of FIG. 1C described previously, indicating that the region of atomic nuclei expected to be excited is widened considerably.

This demonstrates that even atomic nuclei existing between strips in the case of the use of the simple burst wave not undergoing amplitude modulation can be excited, so that the S/N ratio of images is improved.

Figure 6:
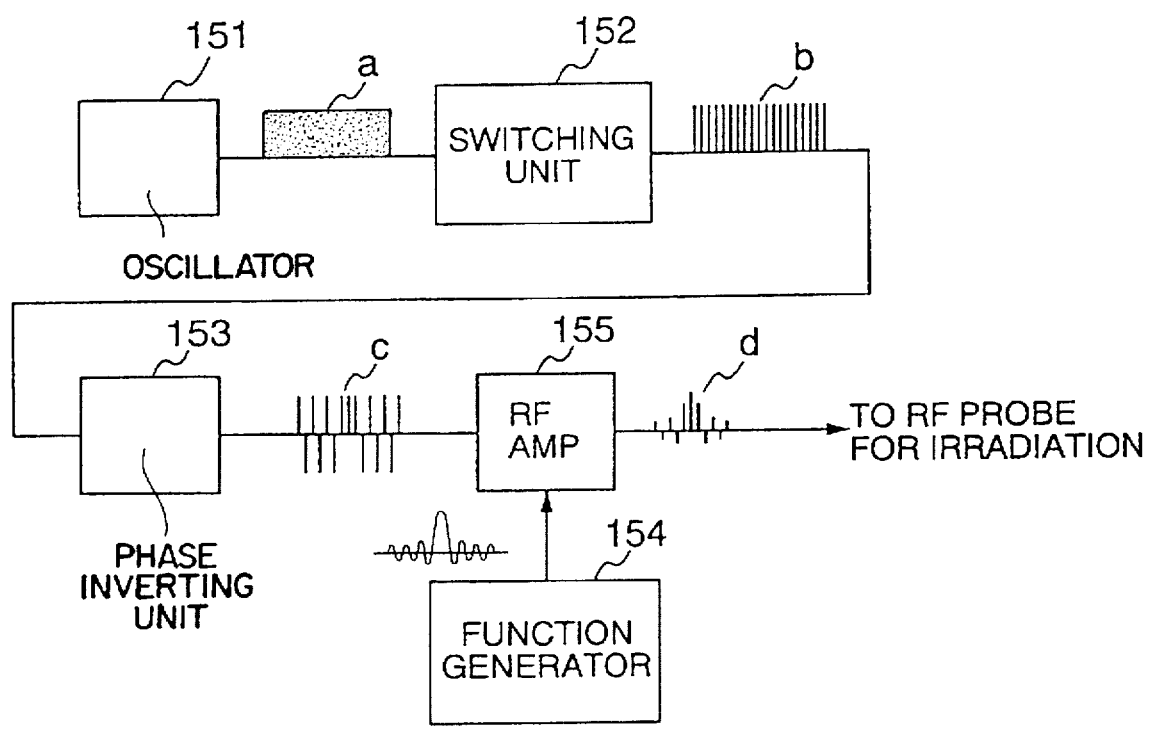
FIG. 6 is a block diagram showing an embodiment of a circuit for generating the burst wave according to the present invention.

FIG. 6 is a block diagram showing an embodiment of a circuit for forming the burst wave amplitude-modulated with the sinc function.

Figure 2A:
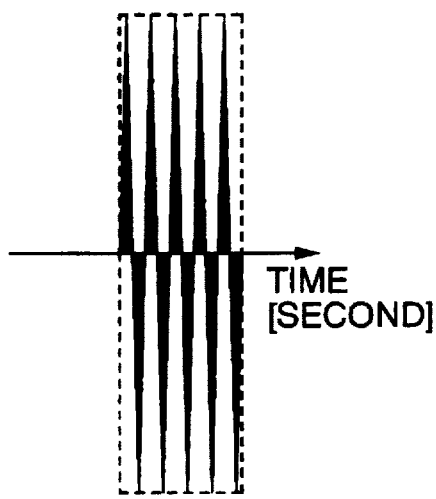
FIGS. 2A to 2D are diagrams for explaining burst waves.
Figure 2B:
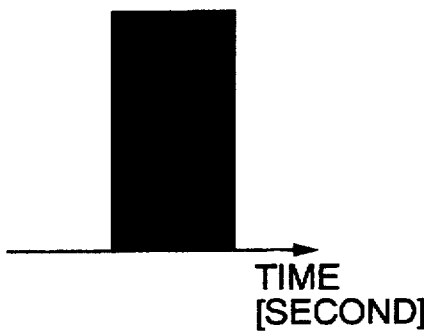
Figure 2C:
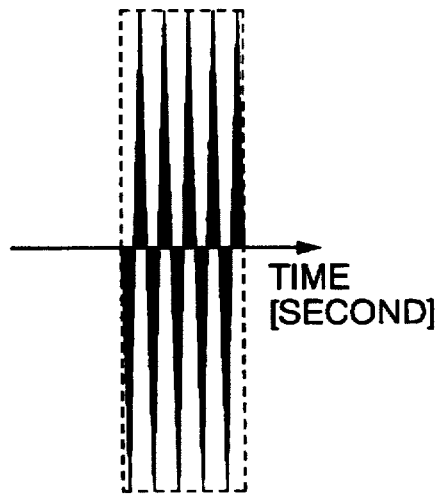
Figure 2D:

Referring to FIG. 6, an oscillator 151 generates a high frequency pulse (a) corresponding to that of FIG. 2B, the pulse (a) being frequency-modulated with a magnetic resonance frequency and having specified time width and amplitude. The high frequency pulse is then fed to a switching unit 152 for repeating on/off of voltage at constant time intervals, so that a burst wave (b) of constant amplitude having a plurality of sub-pulses is prepared. Next, the burst wave of constant amplitude is fed to a phase inverting unit 153 in which the phases of a predetermined number of sub-pulses are inverted to provide a burst wave (c). Denoted by 154 is a function generator for generating a desired function. By inputting the burst wave (c) to an amplifier 155 whose amplification factor changes according to an absolute value of a desired function, a burst wave (d) amplitude-modulated with the intended function can be prepared. The burst wave (d) is applied to an RF probe for irradiation so as to be irradiated on an object to be inspected.

In this case, exchange of the order may obviously be effected between the phase inverting unit 153 and amplifier 155 and/or between the oscillator 151 and switching unit 152. Preferably, the amplitude of a sub-pulse may change slantwise in accordance with the function as shown in FIG. 7A but even when the amplitude remains unchanged over the sub-pulse width as shown in FIG. 7B for simplification of apparatus, the previously-described advantages can be attained sufficiently. In the oscillator 151, the frequency and generation interval of the high frequency pulse (a) can be set freely or may be changed on the way of operation.

In the present embodiment described as above, a gradient magnetic field of constant intensity is applied for a fixed time as a phase encode gradient magnetic field in the imaging pulse sequence of FIG. 3A but a gradient magnetic field of blip form as shown in FIG. 8 may obviously be used. In this case, it is efficient that the phase encode gradient magnetic field of blip form is applied at an instant which is substantially intermediate of two adjacent sub-pulses as shown in FIG. 8. This can be applied to other embodiments of the present invention.

Figure 9A:
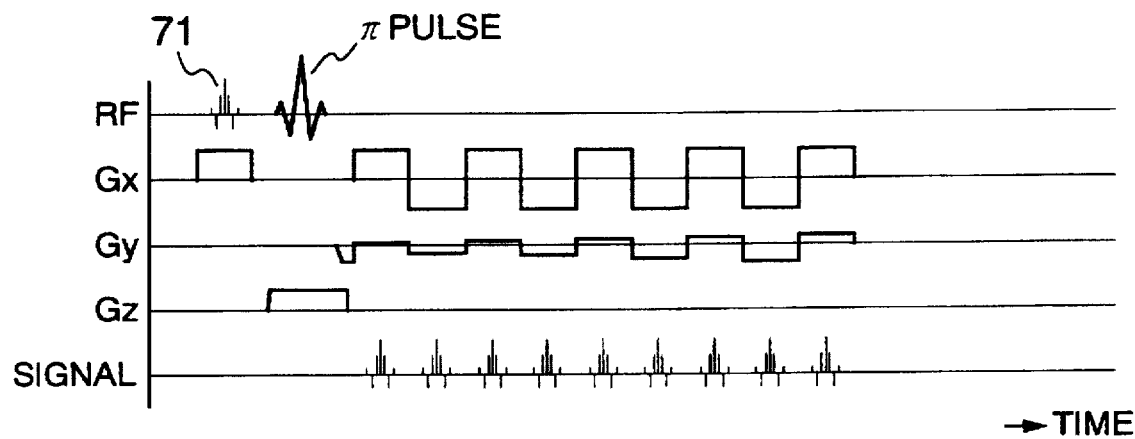
FIGS. 9A and 9B are a time chart and a waveform diagram showing another embodiment of imaging pulse sequence according to the present invention.

FIG. 9A is a time chart illustrative of another embodiment of the inspecting method based on nuclear magnetic resonance according to the present invention, depicting an imaging pulse sequence to be incorporated in the nuclear magnetic resonance apparatus.

Figure 9B:
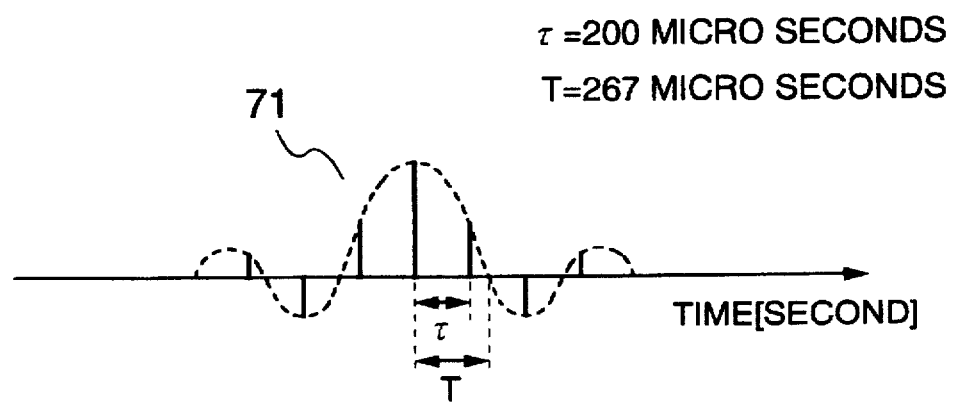

An exciting high frequency pulse in FIG. 9A is a pulse obtained by amplitude-modulating a burst wave of seven sub-pulses with a sinc function as shown in FIG. 9B. The imaging pulse sequence shown in FIG. 9A differs from that shown in FIG. 3A in that while inverting the polarities of read-out gradient magnetic field and phase encode gradient magnetic field simultaneously, the intensity of the phase encode gradient magnetic field is sequentially changed every inversion.

The operation to proceed when the exciting high frequency pulse 11 of the imaging pulse sequence shown in FIG. 3A is replaced directly with the burst wave shown in FIG. 9B will now be considered.

According to the generally prevailing relation, the number of pixels in the phase encode direction (y direction) coincides with the number of NMR signals. In FIG. 9A, spatial resolution of an image in the read-out direction (x direction) is the same for both the case of FIG. 3A and the case where the exciting high frequency pulse 11 of FIG. 3A is replaced with the burst wave 71 shown in FIG. 9B. On the other hand, the number of pixels in the phase encode direction (y direction) is 64 for the case of FIG. 3A but is only 7 equal to the number of sub-pulses for the case where the burst wave of FIG. 9B is used as the exciting high frequency pulse and therefore the view field is narrowed when the spatial resolution is maintained. Conversely, if the same view field is maintained, the spatial resolution becomes insufficient.

Thus, when the number of sub-pulses of the exciting high frequency pulse is small, imaging is carried out while simultaneously inverting the polarities of the read-out gradient magnetic field and phase encode gradient magnetic field and changing the intensity of the phase encode gradient magnetic field each time the inversion occurs as shown in the imaging pulse sequence of FIG. 9A, thereby making it possible to increase the number of pixels in the phase encode direction. This is because by inverting the polarity of the phase encode gradient magnetic field while changing the intensity thereof, a plurality of signals having information pieces which are different for the phase encode direction can be measured.

In the case of the imaging pulse sequence shown in FIG. 9A, the polarity is inverted 9 times while changing the intensity of the phase encode gradient magnetic field and so the number of pixels in the phase encode direction is 7×9=63.

The method of FIG. 9A can also attain the effect of reducing the measurement time even when a burst wave which is not amplitude-modulated is used as the exciting high frequency pulse, as will be detailed below.

Figure 10:
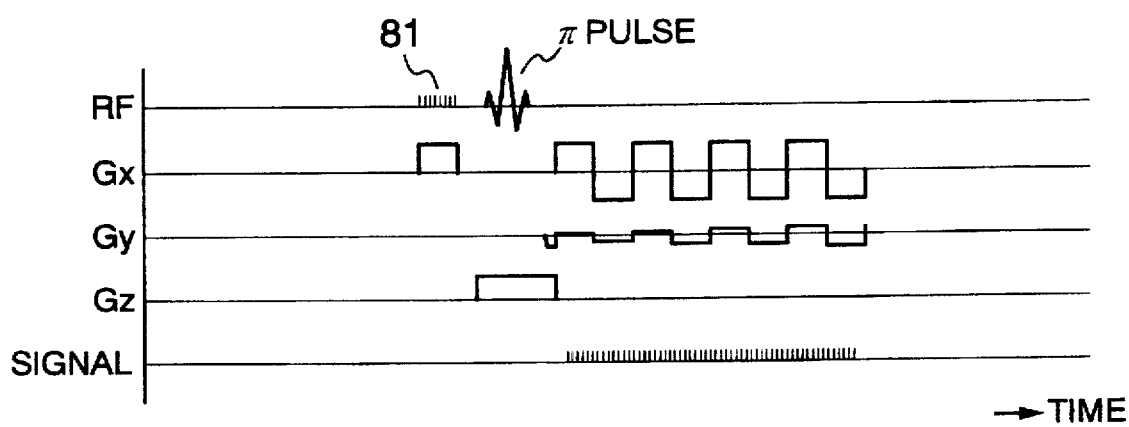
FIG. 10 is a time chart showing still another embodiment of imaging pulse sequence according to the present invention.

FIG. 10 shows an imaging pulse sequence when a burst wave consisting of, for example, 8 sub-pulses is used as an exciting high frequency pulse 81.

It will be appreciated that the application time of the exciting high frequency pulse 81 is shorter in the imaging pulse sequence of FIG. 10 than in the imaging pulse sequence of FIG. 3A using the burst wave of 64 sub-pulses as the exciting high frequency pulse. In the case where a simple burst wave which is not amplitude-modulated is used as the exciting high frequency pulse 81, the flip angle of one sub-pulse generally has a value which is determined by dividing a ($\pi/2$) pulse by the number of sub-pulses. Accordingly, in the imaging pulse sequence of FIG. 1B, the burst wave 21 has 64 sub-pulses and therefore, one sub-pulse has a flip angle of about 1.4° (=90°/64), whereas in the imaging pulse sequence of FIG. 10, one sub-pulse has a flip angle of about 11.3° (=90°/8) which is about 8 times larger. In this case, because of the flip angle of one sub-pulse being 8 times larger, an NMR signal having an 8 times larger amplitude can be obtained, which is advantageous to measurement.

When the total of flip angle values of sub-pulses of the burst wave is set to ($\pi/2$) pulse, about one second is required for an excited hydrogen atomic nucleus to recover the stationary state and therefore the repetition time which elapses up to the next imaging is typically set to be one second or more, whereas the total of flip angle values of sub-pulses in FIGS. 9A and 10 can be set to larger than 90° and smaller than 180° to shorten the repetition time.

Taking the case where the total of flip angle values of sub-pulses is set to 150°, for instance, magnetic moment of an atomic nucleus immediately after the application of the burst wave 150° collapses relative to the stationary state. When a $\pi$ pulse is applied under this condition, magnetic moment of atomic nuclei existing within an imaging slice is inverted. At that time, the magnetic moment of atomic nuclei present within the slice 30° collapses relative to the stationary state.

Accordingly, the time required for recovery to the stationary state can be shorter as compared to the case where the magnetic moment 90° collapses relative to the stationary state. This can afford to make the repetition time shorter and ensure a continual imaging operation.

If the repetition time is long when information necessary for constructing one tomographic image is acquired division by division through a plurality of operations, artifacts will sometimes take place owing to, for example, body motion during the repetition time. But when the total of flip angle values of sub-pulses is set to be larger than 90° and smaller than 180° so as to shorten the repetition time, artifacts can be decreased. This can be applied to all embodiments of the present invention.

Figure 11A:
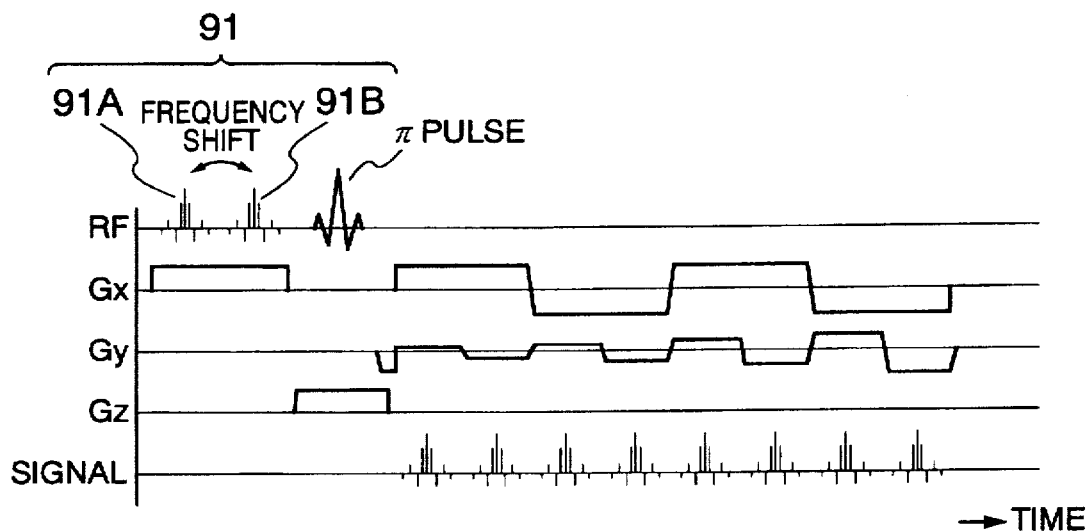
FIGS. 11A and 11B are a time chart and a waveform diagram showing still another embodiment of imaging pulse sequence according to the present invention.

FIG. 11A is a time chart useful to explain another embodiment of the inspecting method based on nuclear magnetic resonance according to the present invention, depicting an imaging pulse sequence to be incorporated in the nuclear magnetic resonance apparatus.

Figure 11B:
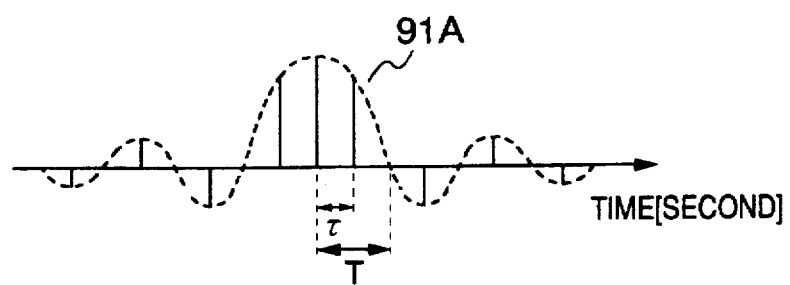

An exciting high frequency pulse 91 consists of an exciting high frequency pulse 91A obtained by amplitude-modulating a burst wave of 9 sub-pulses with a sinc function as shown in FIG. 11B and an exciting high frequency pulse 91B being of the same waveform as that of the exciting high frequency pulse 91A and having sub-pulses modulated with a modulation frequency different from that for sub-pulses of the exciting high frequency pulse 91A.

The interval $\tau$ of the sub-pulses on time axis of the exciting high frequency pulse 91A is set to 200 microseconds and the period T of the sinc function with which the burst wave is amplitude-modulated is set to 400 microseconds on time axis. Since $\tau$ and T are related to the interval on frequency axis after Fourier transform as will be seen from FIG. 4A, a band having a value of substantially zero and the other band not having such a value have the same width on frequency axis. In other words, 50% of atomic nuclei within an imaging slice can be excited.

When a burst wave being of the same waveform as that of the burst wave of FIG. 11B and having sub-pulses modulated with a modulation frequency which is 2.5 kilohertz shifted from that for sub-pulses of the FIG. 11B burst wave is Fourier transformed, there results a waveform as shown in FIG. 11D which is obtained by shifting the waveform of FIG. 11C by exactly the half period, that is, by performing exchange between the band having a value of substantially zero and the band not having such a value in the FIG. 11C waveform.

Thus, by sequentially irradiating the pulse 91A and the exciting high frequency pulse 91B of the burst wave having sub-pulses modulated with the aforementioned 2.5 kHz shifted modulation frequency as shown in the imaging pulse sequence of FIG. 11A, all atomic nuclei within the imaging slice can be excited and the S/N ratio of images can be improved.

Thus, through the use of shifting by a frequency obtained by dividing "reciprocal (1/τ) of interval (τ) of sub-pulses" by "ratio (T/τ) between period (T) of the sinc function and interval (τ) of the sub-pulses", all atomic nuclei within a slice can be excited. In this case, the relation of τ<T stands between τ and T.

In the case of FIG. 11A, the amount of shift f1 of a modulation frequency for sub-pulses is determined by the following equation:

$$\begin{aligned} f1 &= (1/\tau)/(T/\tau) \\ &= \frac{1}{200 \times 10^{-6}} /(400/200) \\ &= 2.5 \text{kHz}. \end{aligned}$$

The above embodiment has been described as using two burst waves having sub-pulses for which modulation frequencies are shifted from each other but may be applied with the use of three or more burst waves amplitude-modulated with a sinc function. In this case, modulation frequencies for sub-pulses of individual burst waves may also be shifted from each other by a frequency (hertz) obtained by dividing "reciprocal (1/τ) of interval of sub-pulses" by "ratio (T/τ) between period (T) of sinc function and interval (τ) of sub-pulses" to attain the effect that all atomic nuclei within an imaging slice can be excited. In this case, τ and T satisfy the relation of τ<T.

This can be applied to every case in which a function having a period (T) is used to the amplitude-modulation.

Figure 12:
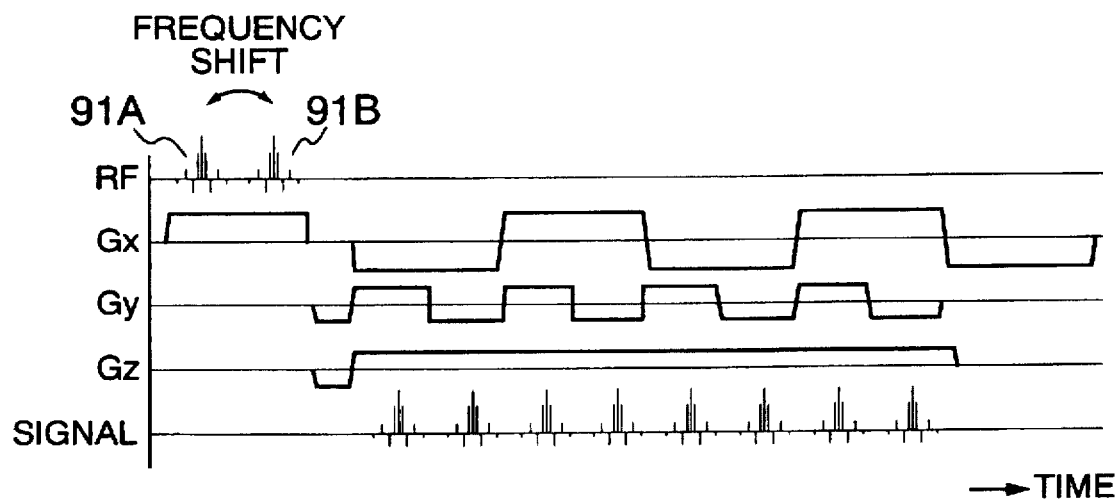
FIG. 12 is a time chart showing still another embodiment of imaging pulse sequence according to the present invention.

In an alternative, by applying a phase encode gradient magnetic field in the z direction without using the r pulse as shown in FIG. 12, a signal having three-dimensional information can be acquired at a high S/N ratio. Namely, in the echo planar imaging method, measurement can be conducted using exciting high frequency pulses 91A and 91B in place of the RF pulse.

Figure 13:
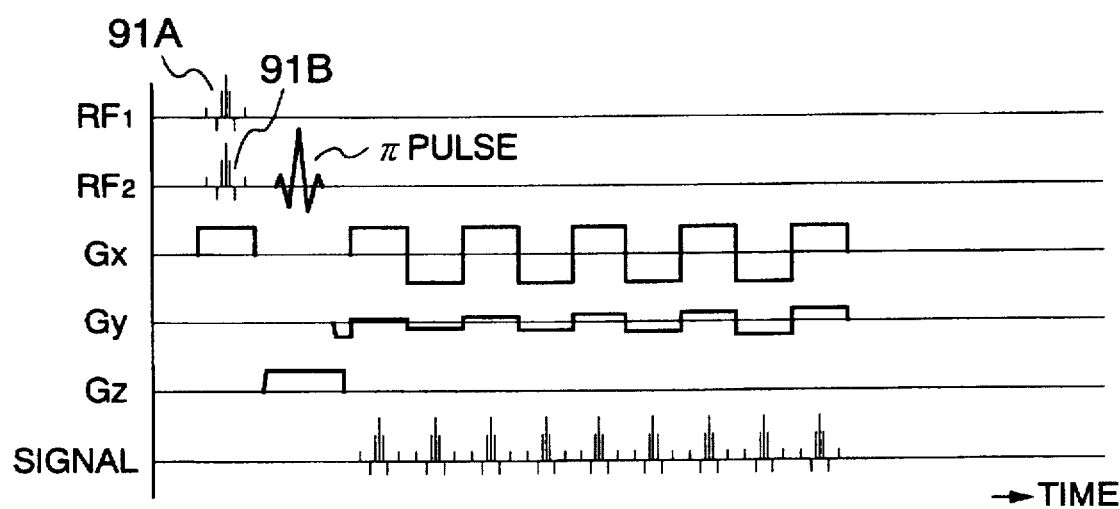
FIG. 13 is a time chart showing an embodiment when the present invention is applied to an inspecting method based on QD irradiation.

In the embodiment of FIG. 11A, the burst waves 91A and 91B having sub-pulses for which modulation frequencies are different are described as being irradiated twice sequentially but instead of the sequential two irradiation operations, the burst wave 91A shown in FIG. 11B and the burst wave 91B being of the same waveform as that of the burst wave 91A and having sub-pulses for which the modulation frequency is 2.5 kHz shifted may be inputted simultaneously to two feeding points for QD irradiation as shown in FIG. 13 so as to attain the effect that all atomic nuclei within an imaging slice can be excited. Generally, the term "QD irradiation" means a scheme in which 90° dephased two exciting high frequency pulses are irradiated in spatially orthogonal two directions.

In the present invention, however, two burst waves 91A and 91B are irradiated to an object to be inspected in spatially orthogonal two directions from RF probes which are arranged at spatially orthogonally positions by shifting the phases of high frequency pulses within a range of from −900° to 900°.

Figure 14:
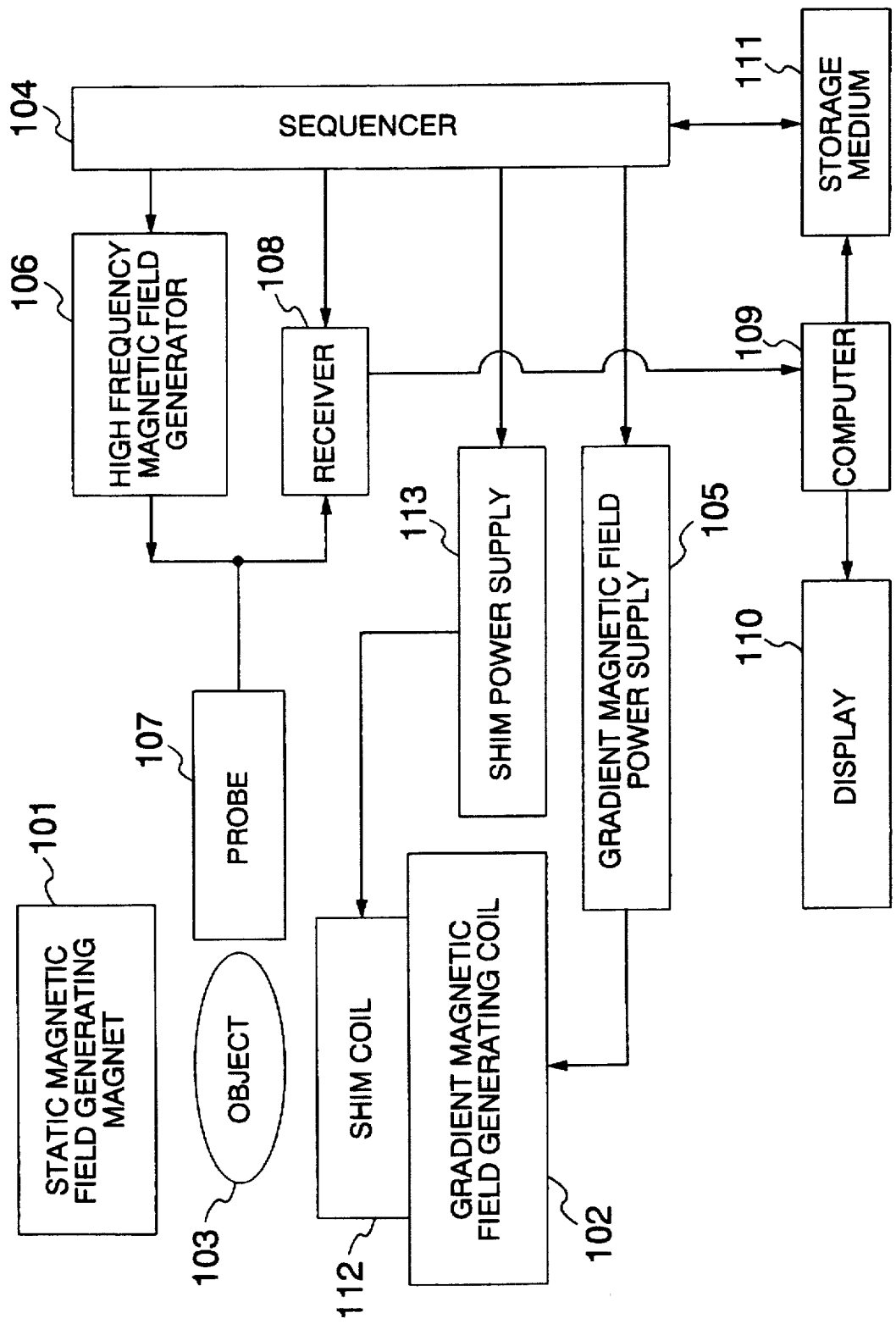
FIG. 14 is a block diagram showing an embodiment of an inspecting apparatus based on nuclear magnetic resonance to which the present invention is applied.

FIG. 14 shows an example of construction of an inspecting apparatus based on magnetic resonance to which the present invention is applied. A magnet 101 generates static magnetic field and a coil 102 generates a gradient magnetic field. An object 103 to be inspected is placed in the magnet 101 and coil 102. A sequencer 104 sends instructions to a gradient magnetic field power supply 105 and a high frequency magnetic field generator 106 including the burst wave generating circuit of FIG. 6 so that a gradient magnetic field and a high frequency magnetic field may be generated from the coil 102 and a probe 107, respectively. The high frequency magnetic field is applied to the object 103 through the probe 107. A signal generated from the object 103 is received by the probe 107 and then detected by a receiver 108. A magnetic resonance frequency used as a reference for detection is set by the sequencer 104. A detected signal is sent to a computer 109 so as to undergo a signal processing such as image reconstruction. A result of the signal processing is displayed on a display 110. As necessary, the signal and measurement conditions can be stored in a storage medium 111. When uniformity of the static magnetic field is required to be adjusted, a shim coil 112 is used. The shim coil 112 consists of a plurality of channels to which currents are supplied from a shim power supply 113. Upon adjustment of uniformity of the static magnetic field, currents flowing through the respective coils are controlled by the sequencer 104. The sequencer 104 sends an instruction to the shim power supply 113 to cause the coil 112 to generate an additional magnetic field which corrects non-uniformity of the static magnetic field. Typically, the sequencer 104 controls the individual components such that they are operated at timings and intensity which are programmed in advance. One of programs which describes timing and intensity of the high frequency magnetic field, gradient magnetic field and signal reception is particularly called an imaging pulse sequence.

In the foregoing embodiments, the burst wave has been described as being modulated in amplitude with the sinc function but the sinc function is not limitative and any function which can be Fourier transformed to broaden the frequency band may be employed. In short, a function which repeats polarity inversion or a function which changes in amplitude during at least a part of duration each time that the polarity inversion occurs may be applied to the present invention.

The imaging pulse sequence is not limited to that described so far but a different imaging pulse sequence may obviously be applicable to the present invention.

The present invention is in no way limited to the foregoing embodiments and various alternations and modifications which fall under the appended claims are also included in the present invention.

We claim:

1. An inspecting method based on nuclear magnetic resonance in which an exciting high frequency pulse, a read-out gradient magnetic field, a phase encode gradient magnetic field and a slice position determining gradient magnetic field are applied in predetermined pulse sequence to an object to be inspected placed in a predetermined magnetic field space to measure a nuclear magnetic resonance signal generated in said object, said method comprising the steps of:

generating a burst wave having a plurality of sub-pulses frequency-modulated with a high frequency;

modulating the amplitude of said burst wave with a function which at least repeats polarity inversion;

irradiating the burst wave modulated with said function to said object as the exciting high frequency pulse; and measuring a nuclear magnetic resonance signal generated in said object by applying the read-out gradient magnetic field, phase encode gradient magnetic field and slice position determining gradient magnetic field.

2. An inspecting method based on nuclear magnetic resonance according to claim 1, wherein the step of modulating said burst wave includes modulating said burst wave during at least a part of duration with a function which changes in amplitude each time that the polarity inversion occurs.

3. An inspecting method based on nuclear magnetic resonance according to claim 1, wherein the step of modulating said burst wave includes modulating the amplitude of said burst wave with a sinc function.

4. An inspecting method based on nuclear magnetic resonance according to claim 1, wherein the step of modulating said burst wave includes determining said function such that the ratio between the interval between adjacent sub-pulses and the period of said function takes a predetermined value which satisfies $\tau<T$, where $\tau$ is the interval and T is the period.

5. An inspecting method based on nuclear magnetic resonance according to claim 4, wherein the step of determining said function includes determining said function such that the following relation is satisfied:

$$T/2 \leq \tau < T.$$

6. An inspecting method based on nuclear magnetic resonance according to claim 1, wherein the step of generating said burst wave includes generating a plurality of burst waves at predetermined intervals and the step of modulating said burst wave includes modulating individual burst waves separately with said function.

7. An inspecting method based on nuclear magnetic resonance according to claim 6, wherein the step of generating said burst waves includes generating sub-pulses constituting individual burst waves by shifting modulation frequencies for the sub-pluses of the individual burst waves from each other by a frequency f1 which is expressed by $$f1=(1/\tau)(T/\tau)$$

where $\tau$ is the interval between adjacent sub-pulses and T is the period of said function.

8. An inspecting method based on nuclear magnetic resonance according to claim 1, wherein the step of generating said burst wave includes setting the total of flip angle values of the sub-pulses to a value which is larger than 90° and smaller than 180°.

9. An inspecting method based on nuclear magnetic resonance according to claim 1, wherein the measuring step includes applying said phase encode gradient magnetic field between adjacent sub-pulses.

10. An inspecting method based on nuclear magnetic resonance according to claim 1, wherein the measuring step includes applying said read-out gradient magnetic field and said phase encode gradient magnetic field while sequentially inverting the polarities of these magnetic fields and changing the intensity of said phase encode gradient magnetic field each time that the polarity inversion occurs.

11. An inspecting method based on nuclear magnetic resonance according to claim 10, wherein the measuring step includes inverting the polarities of said read-out gradient magnetic field and phase encode gradient magnetic field simultaneously.

12. An inspecting method based on nuclear magnetic resonance in which an exciting high frequency pulse, a read-out gradient magnetic field, a phase encode gradient magnetic field and a slice position determining gradient magnetic field are applied in predetermined pulse sequence to an object to be inspected placed in a predetermined magnetic field space to measure a nuclear magnetic resonance signal generated in said object, said method comprising the steps of:

generating a first burst wave having a plurality of sub-pulses modulated with a first frequency;

generating a second burst wave being of the same waveform as that of said first burst wave and having a plurality of sub-pulses modulated with a second frequency which is shifted from the first frequency by a frequency f2 indicated by $$f2=(1/\tau)/2$$

where $\tau$ represents the interval between sub-pulses;

modulating the amplitude of each of said first and second burst waves with a function which at least repeats polarity inversion;

applying said first and second burst waves modulated with said function as exciting high frequency pulses to two feeding points for QD irradiation and irradiating the exciting high frequency pulses to said object; and measuring a nuclear magnetic resonance signal generated in said object by applying said read-out gradient magnetic field, phase encode gradient magnetic field and slice position determining gradient magnetic field.

13. An inspecting method based on nuclear magnetic resonance according to claim 12, wherein the step of modulating said first and second burst waves includes modulating said first and second burst waves during at least a part of duration with a function which changes in amplitude each time that the polarity inversion occurs.

14. An inspecting method based on nuclear magnetic resonance according to claim 12, wherein the step of modulating said first and second burst waves includes modulating the amplitude of said burst waves with a sinc function.

15. An inspecting method based on nuclear magnetic resonance according to claim 12, wherein the step of irradiating said first and second burst waves includes irradiating said first and second burst waves by shifting the phase of the high frequency pulses within a range of from −90° to 90°.

16. An inspecting method based on nuclear magnetic resonance according to claim 12, wherein the step of modulating said first and second burst waves includes determining said function such that the ratio between the interval between the sub-pulses and the period of said function takes a predetermined value which satisfies $\tau<T$, where $\tau$ is the interval and T is the period.

17. An inspecting method based on nuclear magnetic resonance according to claim 12, wherein the step of generating said first and second burst waves includes setting the total of flip angle values of said sub-pulses to a value which is larger than 90° and smaller than 180°.

18. An inspecting method based on nuclear magnetic resonance according to claim 12, wherein the step of measuring said nuclear magnetic resonance signal includes applying said read-out gradient magnetic field and phase encode gradient magnetic field while sequentially inverting the polarities of these magnetic fields and changing the intensity of said phase encode gradient magnetic field each time that the polarity inversion occurs.

19. An inspecting method based on nuclear magnetic resonance according to claim 18, wherein the measuring step includes inverting the polarities of said read-out gradient magnetic field and phase encode gradient magnetic field simultaneously.

20. An inspecting apparatus based on nuclear magnetic resonance comprising:

static magnetic field generating means;

means for generating a burst wave having a plurality of sub-pulses frequency-modulated with a high frequency;

means for modulating the amplitude of said burst wave with a function which at least repeats polarity inversion;

means for irradiating the modulated burst wave to an object to be inspected as an exciting high frequency pulse; and means for measuring a nuclear magnetic resonance signal generated in said object by generating a read-out gradient magnetic field, a phase encode gradient magnetic field and a slice position determining gradient magnetic field in predetermined sequence.

21. A nuclear magnetic resonance inspecting apparatus according to claim 20, wherein said modulating means includes means for amplitude-modulating said burst wave during at least a part of duration with a function which changes in amplitude each time that the polarity inversion occurs.

22. A nuclear magnetic resonance inspecting apparatus according to claim 20, wherein said modulating means modulates the amplitude of said burst wave with a sinc function.

23. A nuclear magnetic resonance inspecting apparatus according to claim 20, wherein said modulating means includes means for determining said function such that the ratio between the interval between adjacent sub-pulses and the period of said function takes a predetermined value which satisfies $\tau<T$, where $\tau$ is the interval and $T$ is the period.

24. A nuclear magnetic resonance inspecting apparatus according to claim 23, wherein said modulating means includes means for determining said function such that the following relation is satisfied:

$$T/2 \leq \tau < T$$

25. A nuclear magnetic resonance inspecting apparatus according to claim 20, wherein said burst generating means includes means for generating a plurality of burst waves at predetermined intervals and said burst wave modulating means includes means for amplitude-modulating said burst waves separately with said function.

26. A nuclear magnetic resonance inspecting apparatus according to claim 25, wherein said burst generating means includes means for generating sub-pulses of individual burst waves by shifting modulation frequencies for the sub-pulses of the individual burst waves from each other by a frequency f1 which is expressed by $$f1=(1/\tau)/(T/\tau)$$

where $\tau$ is the interval between adjacent sub-pulses and T is the period of said function.

27. A nuclear magnetic resonance inspecting apparatus according to claim 20, wherein said burst wave generating means includes means for setting the total of flip angle values of said sub-pulses to a value which is larger than 90° and smaller than 180°.

28. A nuclear magnetic resonance inspecting apparatus according to claim 20, wherein said measuring means includes means for applying said phase encode gradient magnetic field between adjacent sub-pulses.

29. A nuclear magnetic resonance inspecting apparatus according to claim 20, wherein said measuring means includes means for applying said read-out gradient magnetic field and said phase encode gradient magnetic field while sequentially inverting the polarities of these magnetic fields and inverting the intensity of said phase encode gradient magnetic field each time that the polarity inversion occurs.

30. A nuclear magnetic resonance inspecting apparatus according to claim 29, wherein said measuring means includes means for inverting the polarities of said read-out gradient magnetic field and phase encode gradient magnetic field simultaneously.

31. A nuclear magnetic resonance inspecting apparatus according to claim 20, wherein said burst wave generating means includes:

means for generating a first burst wave having a plurality of sub-pluses modulated with a first frequency; and means for generating a second burst wave being of the same waveform as that of said first burst wave and having a plurality of sub-pulses modulated with a second modulation frequency which is shifted from the first modulation frequency by a frequency f2 indicated by $$f2=(1/\tau)/2$$

where $\tau$ represents the interval between adjacent sub-pulses, said modulating means includes:

means for amplitude-modulating each of said first and second burst waves with said function, and said irradiating means includes:

two high frequency pulse irradiating means for QD irradiation arranged spatially orthogonally and each having a feeding point; and means for applying said first and second burst waves subject to modulation to said two feeding points simultaneously and irradiating them to said object.

32. A nuclear magnetic resonance inspecting apparatus according to claim 31, wherein said irradiating means includes means for irradiating said first and second burst waves subject to modulation by shifting the phase of the high frequency pulse within a range of from −90° to 90°.

33. A nuclear magnetic resonance inspecting apparatus according to claim 31, wherein said burst wave generating means includes means for setting the total of flip angle values of said sub-pulses to a value which is larger than 90° and smaller than 180°.

34. A nuclear magnetic resonance inspecting apparatus according to claim 31, wherein said measuring means includes means for applying said read-out gradient magnetic field and phase encode gradient magnetic field while sequentially inverting the polarities of these magnetic fields and changing the intensity of said phase encode gradient magnetic field each time that the polarity inversion occurs.

35. A nuclear magnetic resonance inspecting apparatus according to claim 34, wherein said measuring means includes means for inverting the polarities of said read-out gradient magnetic field and phase encode gradient magnetic field simultaneously.

36. An inspecting method based on nuclear magnetic resonance comprising the steps of:

generating a burst wave having a plurality of sub-pulses frequency-modulated with a high frequency;

modulating the amplitude of the burst wave with a function which at least repeats polarity inversion;

irradiating the burst wave modulated with the function to an object to be inspected as the exciting high frequency; and measuring a nuclear magnetic resonance signal generated in the object by applying a gradient magnetic field.

37. An inspecting method based on nuclear magnetic resonance according to claim 36, wherein the function is a sinc function.

38. An inspecting apparatus based on nuclear magnetic resonance comprising:

a first circuit which generates a burst wave having a plurality of sub-pulses frequency-modulated with a high frequency; and a second circuit which modulates the amplitude of the burst wave with a function which at least repeats polarity inversion;

wherein the burst wave amplitude-modulated is irradiated to an object to be inspected as an exciting high frequency pulse.

39. An inspecting apparatus based on nuclear magnetic resonance according to claim 38, wherein the second circuit modulates the amplitude of the burst wave with a function which changes during at least a part of a duration in amplitude each time that the polarity inversion occurs.

40. An inspecting apparatus based on nuclear magnetic resonance according to claim 38, wherein the second circuit modulates the amplitude of the burst wave with a sinc function.

41. An inspecting apparatus based on nuclear magnetic resonance according to claim 38, wherein the second circuit determines the function such that a ratio between the interval between adjacent sub-pulses and the period of the function has a predetermined value which satisfies $\tau < T$, where $\tau$ is the interval and $T$ is the period.

42. An inspecting apparatus based on nuclear magnetic resonance according to claim 41, wherein the modulating means includes means for determining the function such that the following relation is satisfied:

$T/2 \leq \tau \leq T.$

43. An inspecting apparatus based on nuclear magnetic resonance comprising:

an oscillator which generates a high frequency pulse being frequency-modulated with a magnetic resonance frequency and having a specified time width and a specified amplitude;

a switching unit which is connected to the oscillator and which repeats on/off of voltage at constant intervals to generate a burst wave of constant amplitude having a plurality of sub-pulses frequency-modulated with the high frequency;

a phase inverting unit which inverts the phases of a predetermined number of the sub-pulses to provide a burst wave; and an amplifier which amplifies the amplitude of the burst wave with an amplification factor changing according to an absolute value of a function which at least repeats polarity inversion and generates a burst wave amplitude-modulated with the function;

wherein the burst wave amplitude-modulated is irradiated to an object to be inspected as an exciting high frequency pulse.

44. An inspecting apparatus based on nuclear magnetic resonance according to claim 43, wherein the function is a sinc function.

45. An inspecting apparatus based on nuclear magnetic resonance comprising:

a circuit which generates a burst wave amplitude-modulated with a function which at least repeats polarity inversion;

wherein the burst wave amplitude-modulated is irradiated to an object to be inspected as an exciting high frequency pulse.

46. An inspecting apparatus based on nuclear magnetic resonance according to claim 45, wherein the function is a sinc function.

* * * * *